(12) United States Patent
Kuroki et al.

(10) Patent No.: US 7,710,172 B2
(45) Date of Patent: May 4, 2010

(54) DLL CIRCUIT, SEMICONDUCTOR MEMORY DEVICE USING THE SAME, AND DATA PROCESSING SYSTEM

(75) Inventors: Koji Kuroki, Tokyo (JP); Yasuhiro Takai, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/169,972

(22) Filed: Jul. 9, 2008

(65) Prior Publication Data
US 2009/0039930 A1 Feb. 12, 2009

(30) Foreign Application Priority Data
Jul. 10, 2007 (JP) ............... 2007-181360

(51) Int. Cl.
*H03L 7/06* (2006.01)
(52) U.S. Cl. ...................... 327/158; 327/149
(58) Field of Classification Search ........... None
See application file for complete search history.

(56) References Cited

U.S. PATENT DOCUMENTS 6,518,812 B1 * 2/2003 Sikkink et al. .............. 327/284
6,958,634 B2 * 10/2005 Rashid ....................... 327/141
7,099,232 B2 * 8/2006 Kwak ......................... 365/194
7,203,126 B2 * 4/2007 Proebsting et al. ...... 365/233.12
7,456,672 B1 * 11/2008 Callahan et al. ............. 327/291

FOREIGN PATENT DOCUMENTS

| JP | 11088153 | 3/1999 |
| JP | 11186903 | 7/1999 |
| JP | 2003032104 | 1/2003 |

\* cited by examiner

*Primary Examiner*—Cassandra Cox
(74) *Attorney, Agent, or Firm*—Sughrue Mion, PLLC

(57) ABSTRACT

A DLL circuit includes a delay line (CDL) (10) that delays a clock signal at a relatively coarse adjustment pitch, a delay line (FDL) (20) that delays the clock signal at a relatively fine adjustment pitch, and phase detecting circuits and counter control circuits that control delay amounts of the delay lines (10, 20). The counter control circuits control the delay line (10) by a linear search method, and control the delay line (20) by a binary search method. As a result, even when the number of bits of the count signal for adjusting the delay line (20) is increased, a delay amount can be determined at a high speed.

17 Claims, 11 Drawing Sheets

DLL CIRCUIT, SEMICONDUCTOR MEMORY DEVICE USING THE SAME, AND DATA PROCESSING SYSTEM

TECHNICAL FIELD

The present invention relates to a DLL circuit, and a semiconductor memory device using the same, and, more particularly relates to a DLL circuit having a CDL (Coarse Delay Line) of a coarse adjustment pitch and an FDL (Fine Delay Line) of a fine adjustment pitch, and a semiconductor memory device using the same. The present invention also relates to a data processing system having the semiconductor memory device.

BACKGROUND OF THE INVENTION

In recent years, a synchronous memory that performs the operation synchronously with a clock signal is widely used as a main memory of a personal computer or the like. Among others, a DDR (Double Data Rate) synchronous memory needs to accurately synchronize input and output data with an external clock signal. Therefore, a DLL (Delay Locked Loop) circuit that generates an internal clock signal synchronously with the external clock signal is essential.

The DLL circuit includes a delay line that delays a clock signal, and a control unit that controls a delay amount of the delay line based on a phase of the clock signal. Because the DLL circuit needs to determine the delay amount accurately at a higher speed, both a CDL of a coarse adjustment pitch and an FDL of a fine adjustment pitch are often used (see Japanese Patent Application Laid-open Nos. H11-88153, H11-186903, and 2003-32104). This type of the DLL circuit first sets a rough delay amount using the CDL, and thereafter accurately sets the delay amount using the FDL. As a result, both high speed and accuracy can be established.

Because the synchronous memory uses a clock signal of a very high frequency in recent years, securing of an operation margin is very important. Therefore, high adjustment precision is also required in the DLL circuit. To increase the adjustment precision of the DLL circuit, making a smaller adjustment pitch of the FDL is effective. For example, at the time of adjusting the FDL with a four-bit count signal, a 16-step ($=2^4$) adjustment is possible. At the time of adjusting the FDL with a five-bit count signal, a 32-step ($=2^5$) adjustment is possible. Therefore, theoretically, adjustment precision of two times can be obtained.

However, when the adjustment pitch of the FDL is set small, the number of adjustment steps necessary to determine the delay amount is necessary by that amount. That is, at the time of performing adjustment by a linear search method of incrementing or decrementing the account signal for adjusting the FDL, when the number of bits of the count signal increases by one, the number of adjustment steps is doubled. As a result, it takes time for the adjustment.

On the other hand, when the number of bits of the account signal to adjust the FDL is increased, theoretically, the adjustment precision should become high. However, actually, adjustment precision of the theoretical value cannot be often obtained.

SUMMARY OF THE INVENTION

It is therefore an object of the present invention to provide an improved DLL circuit, and a semiconductor memory device using the same.

Another object of the present invention is to provide a DLL circuit that can determine a delay amount at a fast speed even when the number of bits of a count signal for adjusting an FDL is increased, and a semiconductor memory device using the DLL circuit.

Still another object of the present invention is to provide a DLL circuit of which adjustment precision of the FDL is increased, and a semiconductor memory device using the DLL circuit.

Still another object of the present invention is to provide a data processing system including the semiconductor memory device.

A DLL circuit according to one aspect of the present invention comprises:

a first delay line that delays a clock signal at a relatively coarse adjustment pitch;

a second delay line that delays the clock signal at a relatively fine adjustment pitch; and a control unit that controls delay amounts of the first and second delay lines, the control unit controlling the first delay line by a linear search method and controlling the second delay line by a binary search method.

In the present invention, the "linear search method" refers to a method of searching a desired count value by continuously incrementing or decrementing a count value. However, the count value does not need to be incremented or decremented each one bit, but can be also incremented or decremented by two bits, respectively, for example. On the other hand, the "binary search method" refers to a method of searching a desired count value by sequentially determining a count value from a higher bit.

A DLL circuit according to one aspect of the present invention comprises:

a first delay line that delays a clock signal at a relatively coarse adjustment pitch;

a second delay line that delays the clock signal at a relatively fine adjustment pitch;

a phase detecting circuit that detects a phase of the clock signal; and first and second counter control circuits that sets delay amounts of the first and second delay lines, respectively, based on an output signal of the phase detecting circuit, wherein the second delay line includes a bias circuit that converts a count value of the second counter control circuit to a bias voltage, and a interpolator that change the delay amount of the clock signal corresponding to the bias voltage, the bias circuit includes first and second MOS transistors connected in series in this order between a power source line and the interpolator, and an intermediate potential is supplied to a gate of the first MOS transistor, and a predetermined bit signal of the count value is supplied to a gate of the second MOS transistor.

A semiconductor memory device according to the present invention includes said DLL circuit. A data processing system according to the present invention includes said semiconductor memory device.

According to one aspect of the present invention, the DLL circuit controls the second delay line based on the binary search method. Therefore, even if the number of bits of the count signal to adjust the second delay line is increased, a delay amount can be determined at a high speed. On the other hand, when the frequency of the clock signal is very high, the adjustment pitch of the first delay line to the clock cycle is too coarse, and therefore, the adjustment using the first delay line is not substantially effective. Consequently, when the first delay line is controlled using the binary search method, it takes a wasteful time. However, according to the present invention, because the first delay line is controlled by the linear search method, the control of the first delay line can be completed immediately.

Further according to another aspect of the present invention, the DLL circuit has the first MOS transistor inserted into between the second MOS transistor to which a predetermined value of the count value is supplied and the power source line. Further, the intermediate potential is supplied to the gate of this transistor. Therefore, the first MOS transistor becomes in the conducted state in the saturation region. Consequently, the current supplied to the source of the second MOS transistor becomes at a constant value, and the adjustment precision of the second delay line can be increased.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
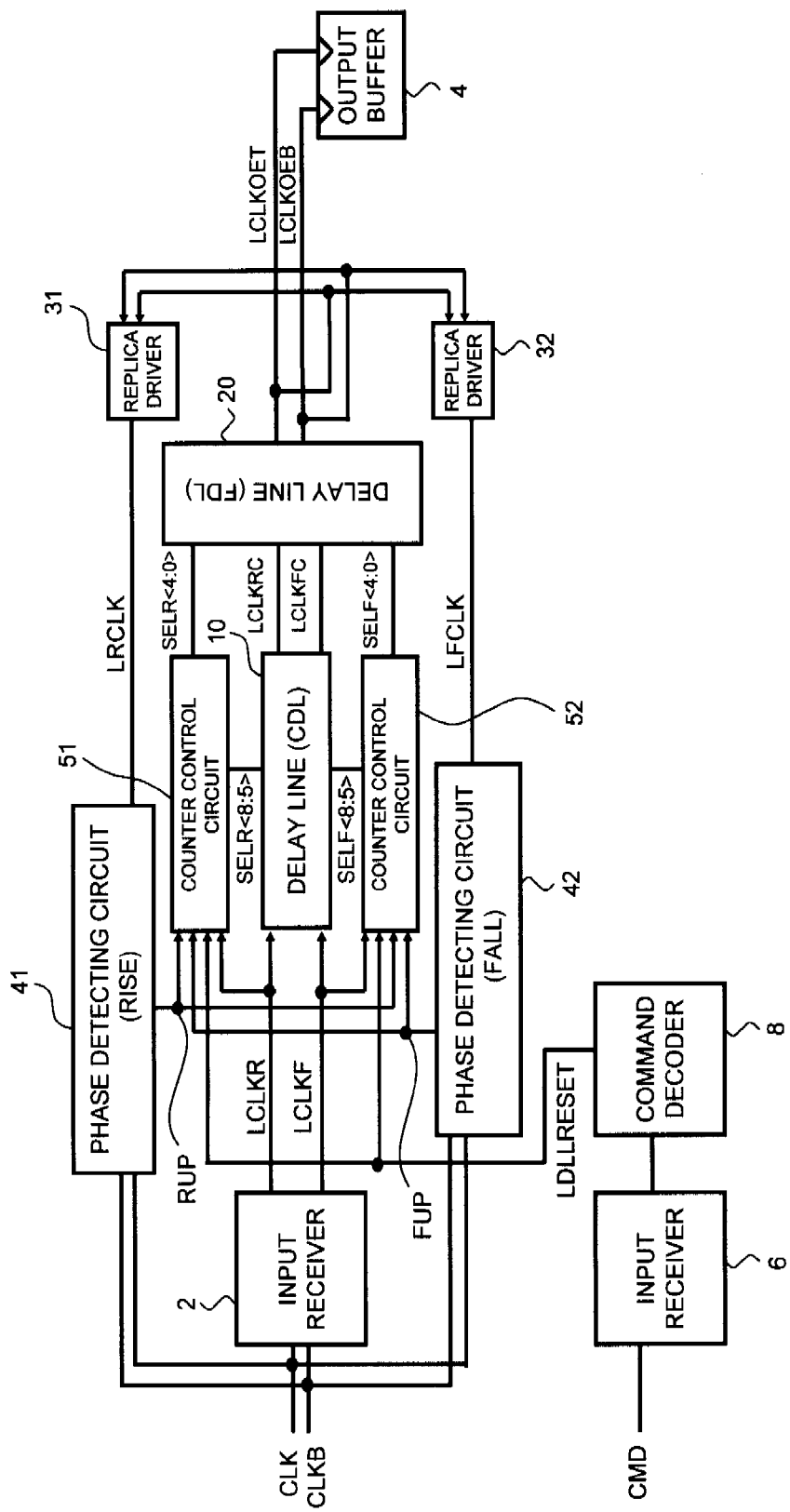
FIG. 1 is a block diagram showing a configuration of a DLL circuit according to a preferred embodiment of the present invention.

FIG. 1 is a block diagram showing a configuration of a DLL circuit according to a preferred embodiment of the present invention.

As shown in FIG. 1, the DLL circuit according to the present embodiment includes an input receiver 2 that generates complementary clock signals LCLKR and LCLKF by receiving complementary clock signals CLK and CLKB, a first delay line 10 (CDL) that generates clock signals LCLKRC and LCLKFC by delaying the clock signals LCLKR and LCLKF at a relatively coarse adjustment pitch, and a second delay line 20 (FDL) that generates clock signals LCLKOET and LCLKOEB by delaying the clock signals LCLKRC and LCLKFC at a relatively fine adjustment pitch.

The generated clock signals LCLKOET and LCLKOEB are supplied to an output buffer 4. The output buffer 4 outputs data synchronously with the clock signals LCLKOET and LCLKOEB.

The clock signals LCLKOET and LCLKOEB are also supplied to replica drivers 31 and 32 substantially having the same configurations as that of the output buffer 4, and their output reference clock signals LRCLK and LFCLK are supplied to phase detecting circuits 41 and 42. The phase detecting circuit 41 is a circuit that determines a phase based on a rising edge of the clock signal CLK (a falling edge of the clock signal CLKB). The phase detecting circuit 42 is a circuit that determines a phase based on a falling edge of the clock signal CLK (a rising edge of the clock signal CLKB).

The phase detecting circuit 41 determines whether the phase of a reference clock signal LRCLK is advanced from those of the clock signals CLK and CLKB. If the phase of the reference clock signal LRCLK is advanced from those of the clock signals CLK and CLKB, the phase detecting circuit 41 sets a detection signal RUP to a low level to delay the reference clock signal LRCLK. If the phase of the reference clock signal LRCLK is delayed from those of the clock signals CLK and CLKB, the phase detecting circuit 41 sets the detection signal RUP to a high level to advance the reference clock signal LRCLK. Similarly, the phase detecting circuit 42 determines whether the phase of a reference clock signal LFCLK is advanced from those of the clock signals CLK and CLKB. If the phase of the reference clock signal LFCLK is advanced from those of the clock signals CLK and CLKB, the phase detecting circuit 42 sets a detection signal FUP to a low level to delay the reference clock signal LFCLK. If the phase of the reference clock signal LFCLK is delayed from those of the clock signals CLK and CLKB, the phase detecting circuit 42 sets the detection signal FUP to a high level to advance the reference clock signal LFCLK.

The detection signals RUP and FUP are supplied to counter control circuits 51 and 52. The counter control circuits 51 and 52 are circuits that control delay amounts of the delay lines 10 and 20, and are started when a control signal LDLLRESET is issued. The control signal LDLLRESET is generated when a command CMD supplied from the outside via an input receiver 6 is detected as a predetermined command by a command decoder 8. The predetermined command includes a command issued when a power source is turned, and a command issued when a mode returns from a self-refresh mode.

As explained above, the phase detecting circuits 41 and 42 and the counter control circuits 51 and 52 are circuits that control delay amounts of the delay lines 10 and 20. These are also collectively called a "control unit".

Figure 2:
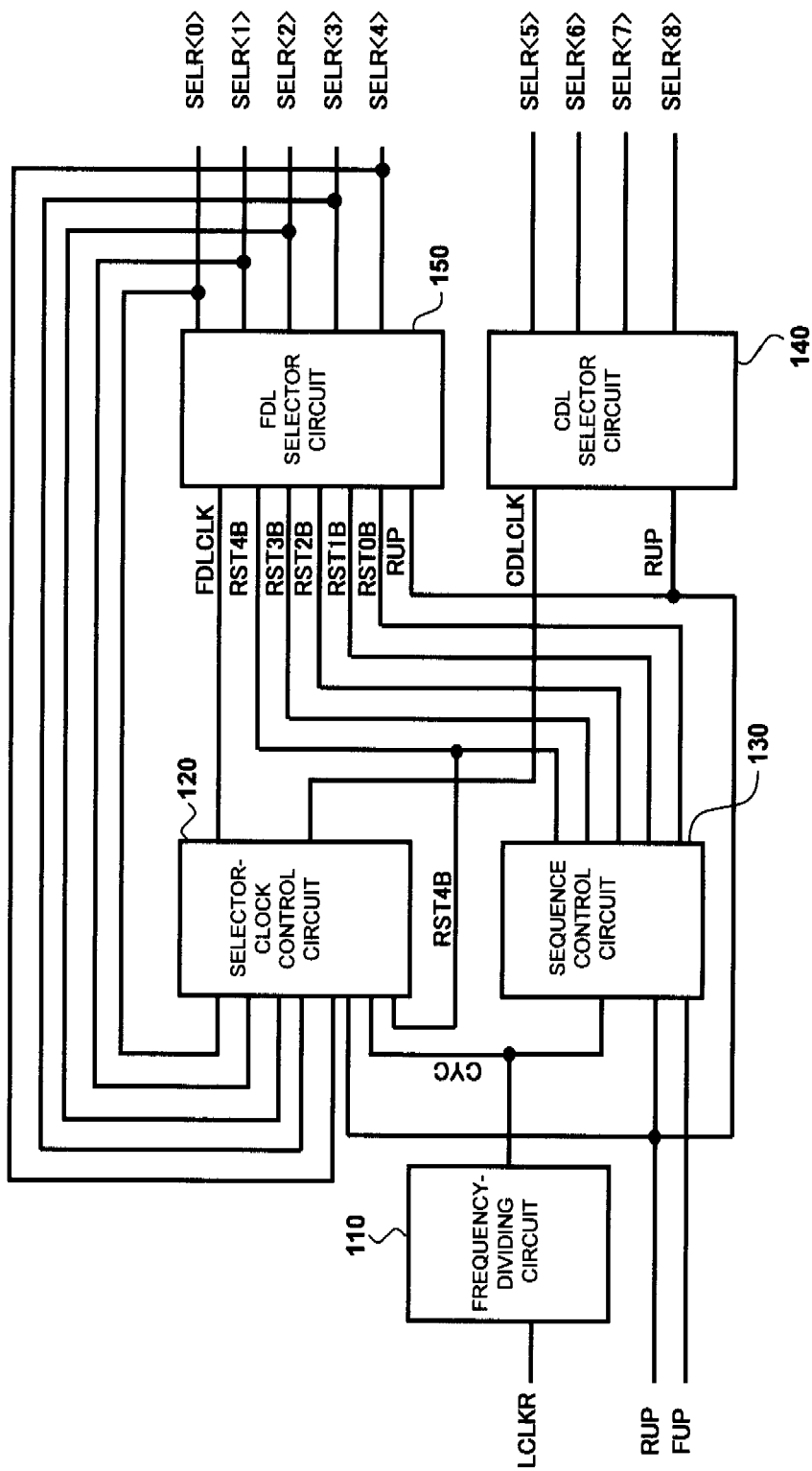
FIG. 2 is a block diagram showing a configuration of the counter control circuit shown in FIG. 1.

FIG. 2 is a block diagram showing a configuration of the counter control circuit 51. Because the configuration of the counter control circuit 52 is substantially the same as that of the counter control circuit 51, redundant explanations thereof will be omitted.

As shown in FIG. 2, the counter control circuit 51 includes a frequency-diving circuit 110, a selector-clock control circuit 120, a sequence control circuit 130, a CDL selector circuit 140, and an FDL selector circuit 150.

The frequency-dividing circuit 110 is a circuit that generates a cycle signal CYC by frequency-diving the clock signal LCLKR. The generated cycle signal CYC is supplied to the selector-clock control circuit 120, and the sequence control circuit 130. The selector clock control circuit 120 is a circuit that generates an operation clock CDLCLK of the CDL selector circuit 140, and an operation clock FDLCLK of the FDL selector circuit 150. The sequence control circuit 130 is a circuit that generates strobe signals RST0B to RST4B, based on the detection signals RUP and FUP and the cycle signal CYC.

Further, the CDL selector circuit 140 functions as a first counter circuit that sets a delay amount of the first delay line 10 as the CDL, and operates based on the operation clock CDLCLK and the detection signal RUP. The FDL selector circuit 150 functions as a second counter circuit that sets a delay amount of the second delay line 20 as the FDL, and operates based on the operation clock FDLCLK, the detection signal RUP, and the strobe signals RST0B to RST4B.

Figure 3:
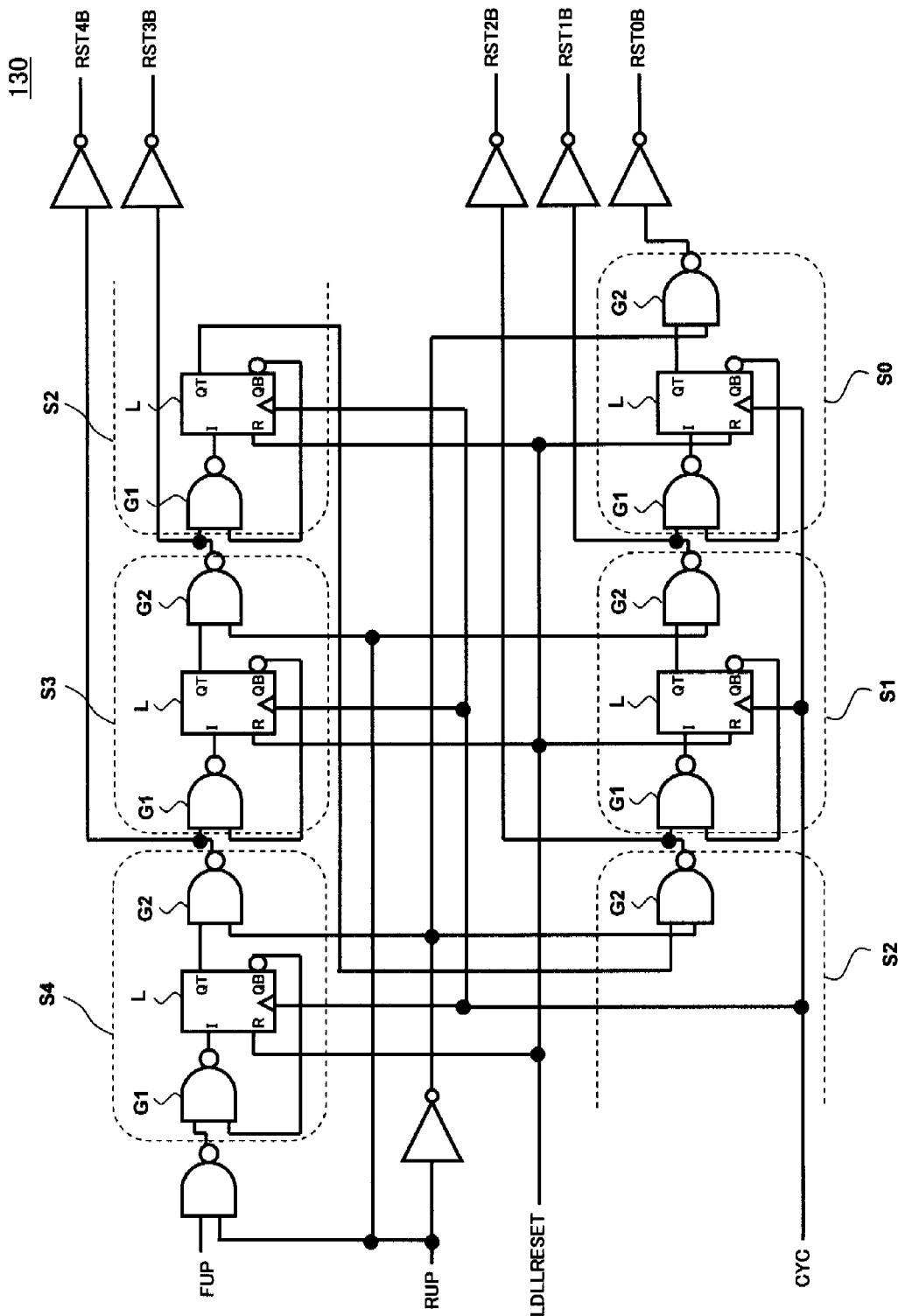
FIG. 3 is a circuit diagram of the sequence control circuit shown in FIG. 2.

FIG. 3 is a circuit diagram of the sequence control circuit 130.

As shown in FIG. 3, the sequence control circuit 130 has a configuration that five circuit sets S4 to S0, including a connection of a latch circuit L between two NAND gates G1 and G2, are connected in cascade.

The control signal LDLLRESET is supplied to a reset terminal of the latch circuit L included in each of the circuit sets S4 to S0. Therefore, when the control signal LDLLRESET is activated, a low level is latched to all the latch circuits L.

The NAND gate G1 included in each of the circuit sets S4 to S0 has an output of a pre-stage circuit supplied to one input terminal, and has an inverted output of the latch circuit L supplied to the other input terminal. The NAND gate of the first-stage circuit set S4 is supplied with a NAND signal of the detection signals RUP and FUP.

The NAND gate G2 included in each of the circuit sets S4 to S0 has an output of the latch circuit L supplied to one input terminal, and has the detection signal RUP or its inverted signal supplied to the other input terminal. More specifically, the detection signal RUP is supplied to the NAND gate G2 of the circuit sets S3 and S1, and the inverted signal of the detection signal RUP is supplied to the NAND gate G2 of the circuit sets S4, S2, and S0.

The inverted outputs of the circuit sets S4 to S0 are used as the strobe signals RST0B to RST4B, respectively.

When the control signal LDLLRESET is activated based on the above circuit configuration, all the strobe signals RST0B to RST4B become at a high level. Thereafter, the strobe signals RST0B to RST4B become at a low level in this order corresponding to the change of the detection signals RUP and FUP. That is, all the latch circuits L become at a low level in response to the activation of the control signal LDLLRESET. However, once the latch circuits L change to a high level, the high level does not return to the low level until when the control signal LDLLRESET is activated again. The latter-stage latch circuit L is not inverted when the pre-stage latch circuit becomes at the high level. Therefore, the strobe signals can change only in the order of RST4B to RST0B.

The FDL selector circuit 150 generates count values SELR4 to SELR0, based on the strobe signals RST4B to RST40.

Figure 4:
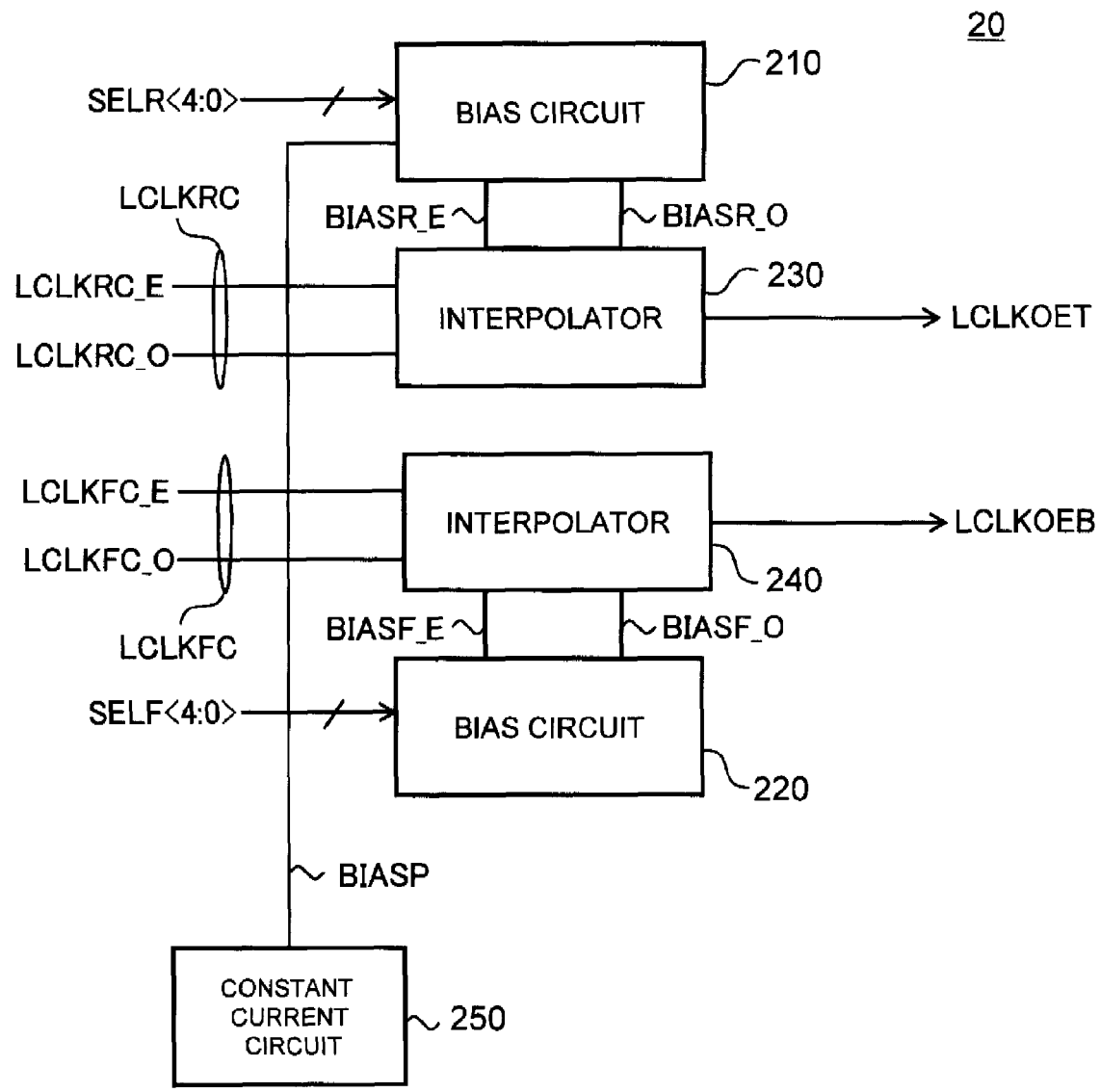
FIG. 4 is a block diagram of the second delay line shown in FIG. 1.

FIG. 4 is a block diagram of the second delay line 20.

As shown in FIG. 4, the second delay line 20 as the FDL includes bias circuits 210 and 220 that convert the count values of the counter control circuits 51 and 52 into bias voltages, and interpolators 230 and 240 that change the delay amounts of the clock signals LCLKRC and LCLKFC, corresponding to the bias voltages. As shown in FIG. 4, the clock signal LCLKRC includes the two signals LCLKRC_E and LCLKRC_O, and the clock signal LCLKFC includes the two signals LCLKFC_E and LCLKFC_O.

The bias circuit 210 is supplied with the count values SELR4 to SELR0 of the counter control circuit 51 and an intermediate potential BIASP generated by a constant current source 250, and generates bias signals BIASR_E and BIASR_O. Similarly, the bias circuit 220 is supplied with the count values SELF4 to SELF0 of the counter control circuit 52 and an intermediate potential BIASP, and generates bias signals BIASF_E and BIASF_O.

Figure 5:
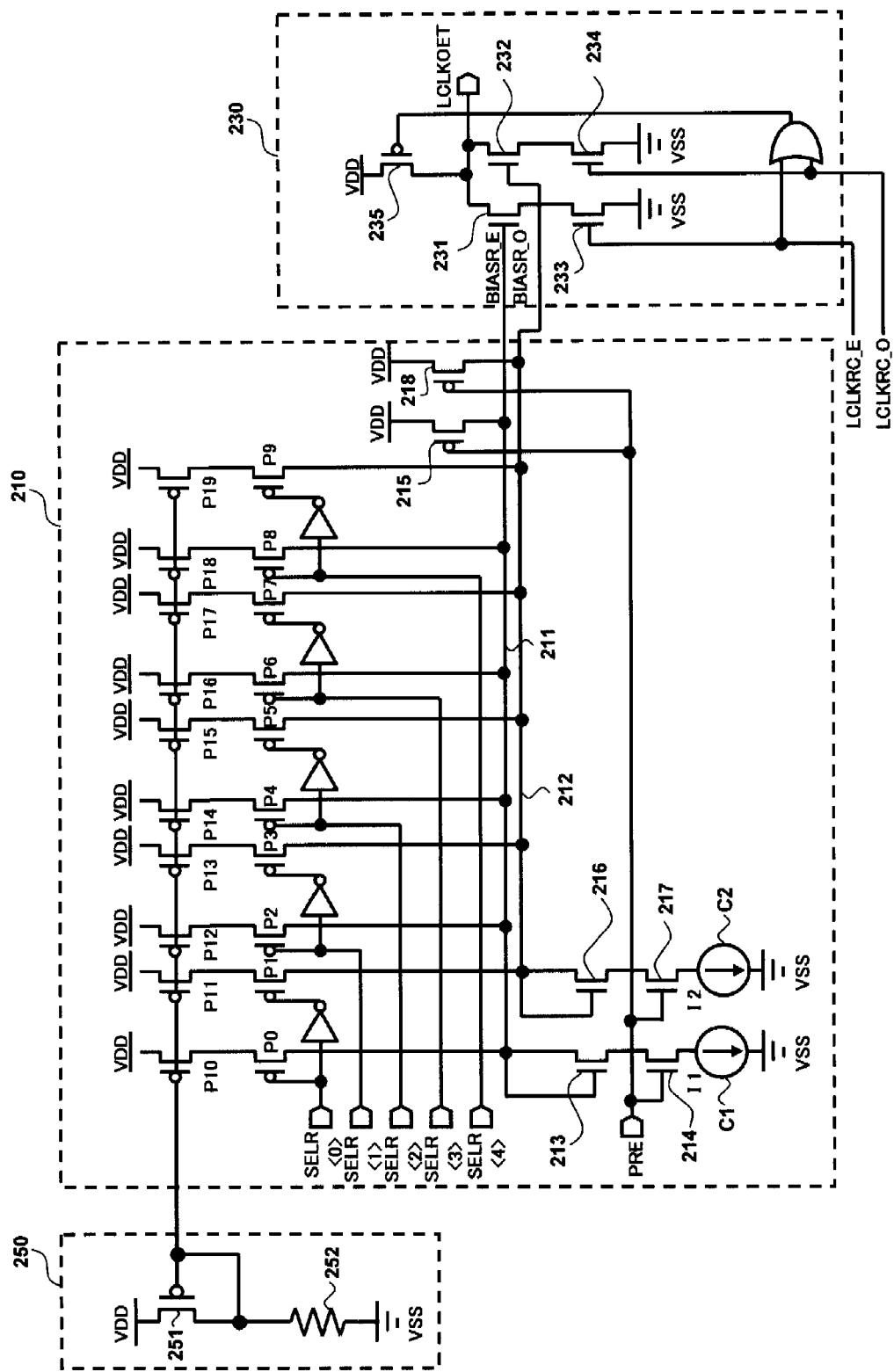
FIG. 5 is a circuit diagram showing in detail a configuration of the second delay line.

FIG. 5 is a circuit diagram showing in detail a configuration of the second delay line 20. Particularly, FIG. 5 shows a part including the bias circuit 210, the interpolator 230, and the constant current source 250. Because the circuit configurations of the bias circuit 220 and the interpolator 240 are substantially the same as those of the bias circuit 210 and the interpolator 230 shown in FIG. 5, redundant explanations thereof will be omitted.

As shown in FIG. 5, the bias circuit 210 has plural series-connected two-P-channel MOS transistors connected in parallel between a power source line VDD and a wiring 211 to which the bias signal BIASR_E is supplied. The bias circuit 210 also has plural series-connected two-P-channel MOS transistors connected in parallel between the power source line VDD and a wiring 212 to which the bias signal BIASR_O is supplied. Out of these P-channel MOS transistors, bits corresponding to the count values SELR4 to SELR0 are supplied to gates of transistors P0 to P9, and the intermediate potential BIASP is supplied in common to gates of transistors P10 to P19.

Further, between the wiring 211 and the ground wiring VSS, a diode-connected N-channel MOS transistor 213, an N-channel MOS transistor 214 which is turned on synchronously with the precharge signal, and a constant current source C1 are connected in series. Between the wiring 211 and the power source line VDD, a P-channel MOS transistor 215 which is turned on synchronously with the precharge signal is connected. Similarly, between the wiring 212 and the ground wiring VSS, a diode-connected N-channel MOS transistor 216, an N-channel MOS transistor 217 which is turned on synchronously with the precharge signal, and a constant current source C2 are connected in series. Between the wiring 212 and the power source line VDD, a P-channel MOS transistor 218 which is turned on synchronously with the precharge signal is connected.

A W/L ratio (a ratio of a channel width and a channel length) of the transistors P0 to P9 is weighted by a power of 2. Specifically, when the W/L ratio of the transistors P0 and P1 is defined as 1 WL, the W/L ratio of the transistors P2 and P3 is set to 2 WL, the W/L ratio of the transistors P4 and P5 is set as 4 WL, the W/L ratio of the transistors P6 and P7 is set to 8 WL, and the W/L ratio of the transistors P8 and P9 is set to 16 WL. Accordingly, the bias signals BIASF_E, BIASF_O can be adjusted to a voltage level at 32 steps ($=2^5$)

The bias signals BIASF_E and BIASF_O generated in this way are supplied to gates of the N-channel MOS transistors 231 and 232 included in the interpolator 230.

As shown in FIG. 5, an N-channel MOS transistor 233 which is turned on synchronously with the clock signal LCLKRC_E is connected to between the transistor 231 and the ground wiring VSS. An N-channel MOS transistor 234 which is turned on synchronously with the clock signal LCLKRC_O is connected to between the transistor 232 and the ground wiring VSS. Further, between the transistors 231 and 232 and the power source line VDD, a P-channel MOS transistor 235 which is turned on synchronously with an OR signal of the clock signals LCLKRC_E and LCLKRC_O.

Based on the above circuit configuration, the phase of the clock signal LCLKOET as the output of the interpolator 230 is adjusted at 32 stages, corresponding to the voltages of the bias signals BIASF_F and BIASF_O.

The constant current power 250 that supplies the intermediate potential BIASP to the transistors P10 to P19 includes the P-channel MOS transistor 251 and a resistor 252 connected in series. A gate and a drain of the transistor 251 are short-circuited, and a gate potential of the transistor 251 is taken out as the intermediate potential BIASP. That is, the constant current source 250 constitutes the input side of a current mirror circuit, and the transistors P10 to P19 constitute the output side of the current mirror circuit.

Based on the above configuration, the transistors P10 to P19 operate in the saturation region, and their drain currents are limited to a predetermined current prescribed by the current mirror circuit. As a result, the drain current of the transistors P0 to P9 that are turned on/off by the current values SELR 4 to 0 become predetermined values irrelevant to the drain voltages. Consequently, adjustment pitches of the bias signals BIASF_E and BIASF_O can be made substantially uniform.

On the other hand, when the transistors P10 to P19 are deleted and when the sources of the transistors P0 to P9 are directly connected to the power source line VDD, these transistors P0 to P9 operate in an unsaturated region. Therefore, the drain currents are changed by the drain voltages. As a result, adjustment pitches of the bias signals BIASF_E and BIASF_O cannot be made uniform. Consequently, even when the number of bits of the count value SELR is increased, adjustment precision does not become sufficiently high.

Figure 6A:
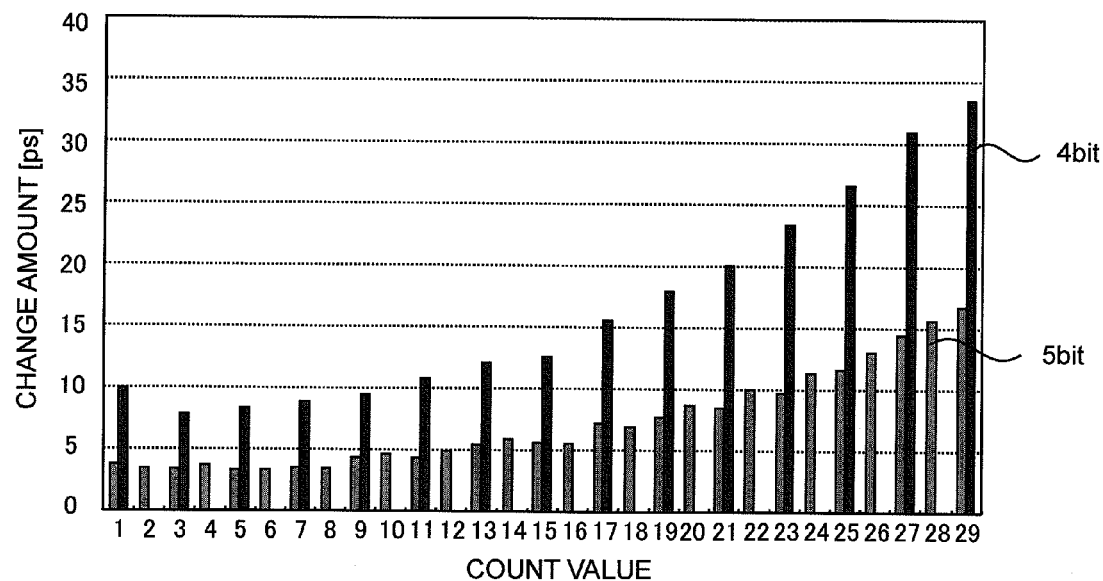
FIG. 6A is a graph for explaining the effect of the constant current source in the case where the transistors P10 to P19 are deleted.
Figure 6B:
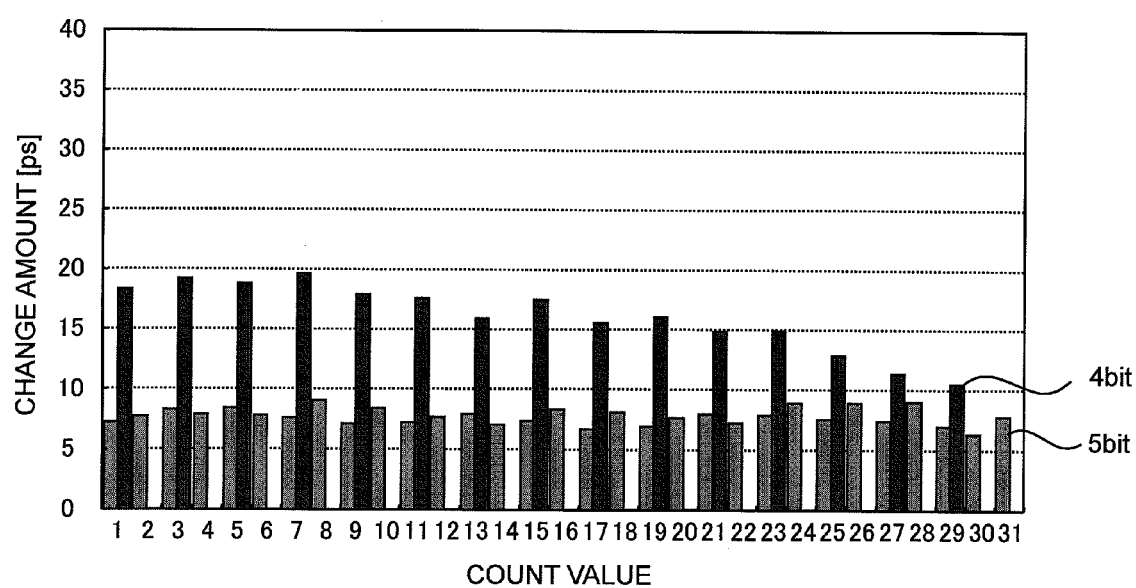
FIG. 6B is a graph for explaining the effect of the constant current source in the case where the intermediate potential BIASP is given to the gates of the transistors P10 to P19.

FIGS. 6A and 6B are graphs for explaining the effect of the constant current source 250, and show a change amount of a clock signal, that is, an adjustment pitch, obtained when the count value is changed by one. FIG. 6A shows the graph that the transistors P10 to P19 are deleted, and FIG. 6B shows the graph that the intermediate potential BIASP is given to the gates of the transistors P10 to P19.

As shown in FIG. 6A, when the transistors P10 to P19 are deleted, it can be understood that the adjustment pitch increases when the count value becomes large. Therefore, even when the number of bits of the count value SELR is increased from four to five, the adjustment precision does not become so high.

However, as shown in FIG. 6B, when the intermediate potential BIASP is given to the gates of the transistors P10 to P19, it can be understood that the adjustment pitch becomes substantially constant regardless of the count value. Therefore, when the number of bits of the count value SELR is increased from four to five, the adjustment precision can be increased.

An operation of the DLL circuit according to the present embodiment is explained next.

Figure 7:
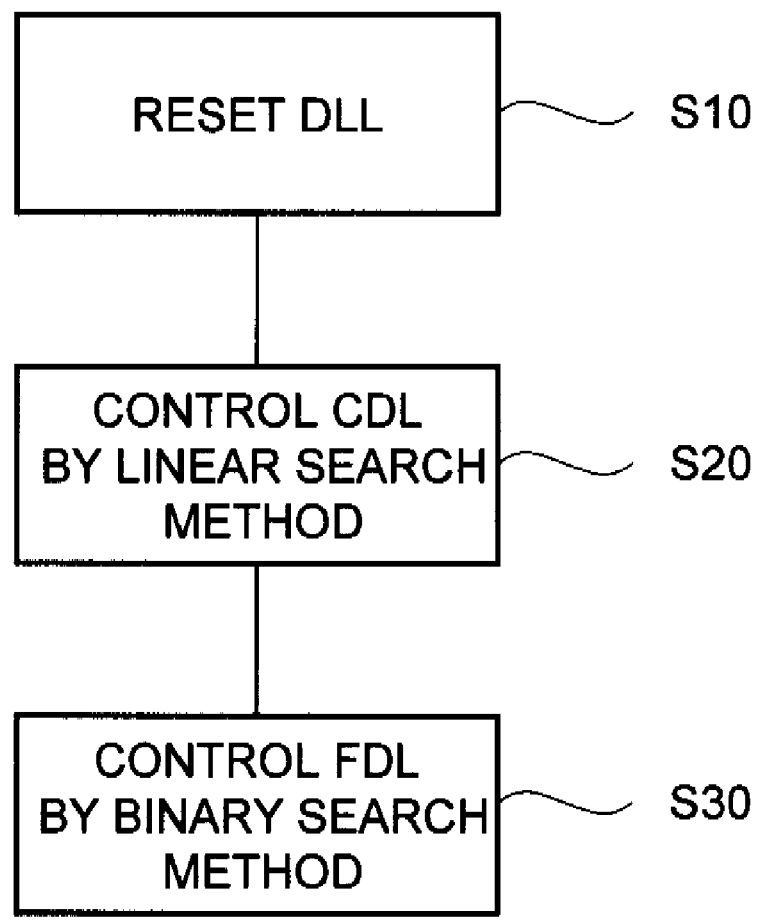
FIG. 7 is a flowchart for explaining the brief operation of the DLL circuit according to the preferred embodiment of the present invention.

FIG. 7 is a flowchart for explaining the brief operation of the DLL circuit according to the present embodiment.

As shown in FIG. 7, when the reset of the DLL circuit is instructed (step S10), the sequence control circuit 130 performs the CDL sequence using the linear search method (step S20). When the sequence control circuit 130 performs the FDL sequence using the binary search method (step S30), the DLL circuit is locked. The reset of the DLL circuit is performed when the power source is turned on when the mode returns from the self-refresh mode, as described above. In response to this, the control signal LDLLRESET is activated.

Figure 8:
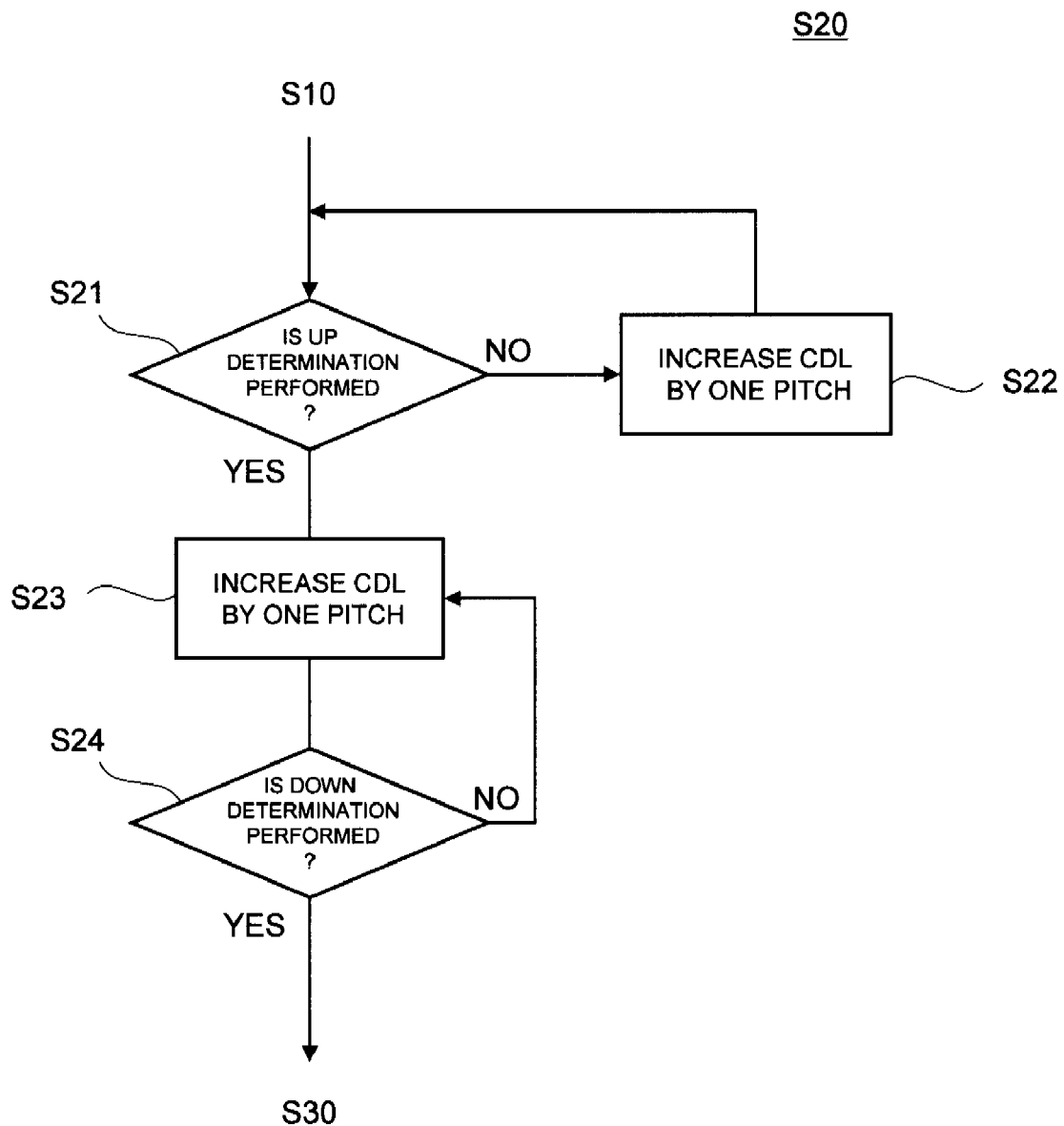
FIG. 8 is a flowchart showing further details of the CDL sequence.

FIG. 8 is a flowchart showing further details of the CDL sequence (step S20).

In the CDL sequence, until when the phase detecting circuits 41 and 42 perform an UP determination, the delay amount is increased by each one pitch using the delay line 10 (steps S21 and S22). The "UP determination" refers to a case that the reference clock signals LRCLK and LFCLK need to be advanced because the phases of the reference clock signals LRCLK and LFCLK are delayed from the clock signals CLK and CLKB.

Next, when the phase detecting circuits 41 and 42 perform the UP determination, the phase detecting circuits 41 and 42 increase the delay amount by each one pitch using the delay line 10 until when performing a DOWN determination (steps S23 and S24). The "DOWN determination" refers to the case where the reference clock signals LRCLK and LFCLK need to be delayed because the phases of the reference clock signals LRCLK and LFCLK are advanced from the clock signals CLK and CLKB.

When the phase detecting circuits 41 and 42 perform the DOWN determination, the CDL sequence ends, and the CDL sequence shifts to the FDL sequence next. As explained above, because in the CDL sequence, the delay amount is changed by each one pitch using the linear search method, the control of the delay line 10 is immediately completed when the frequency of the clock signal is very high.

Figure 9:
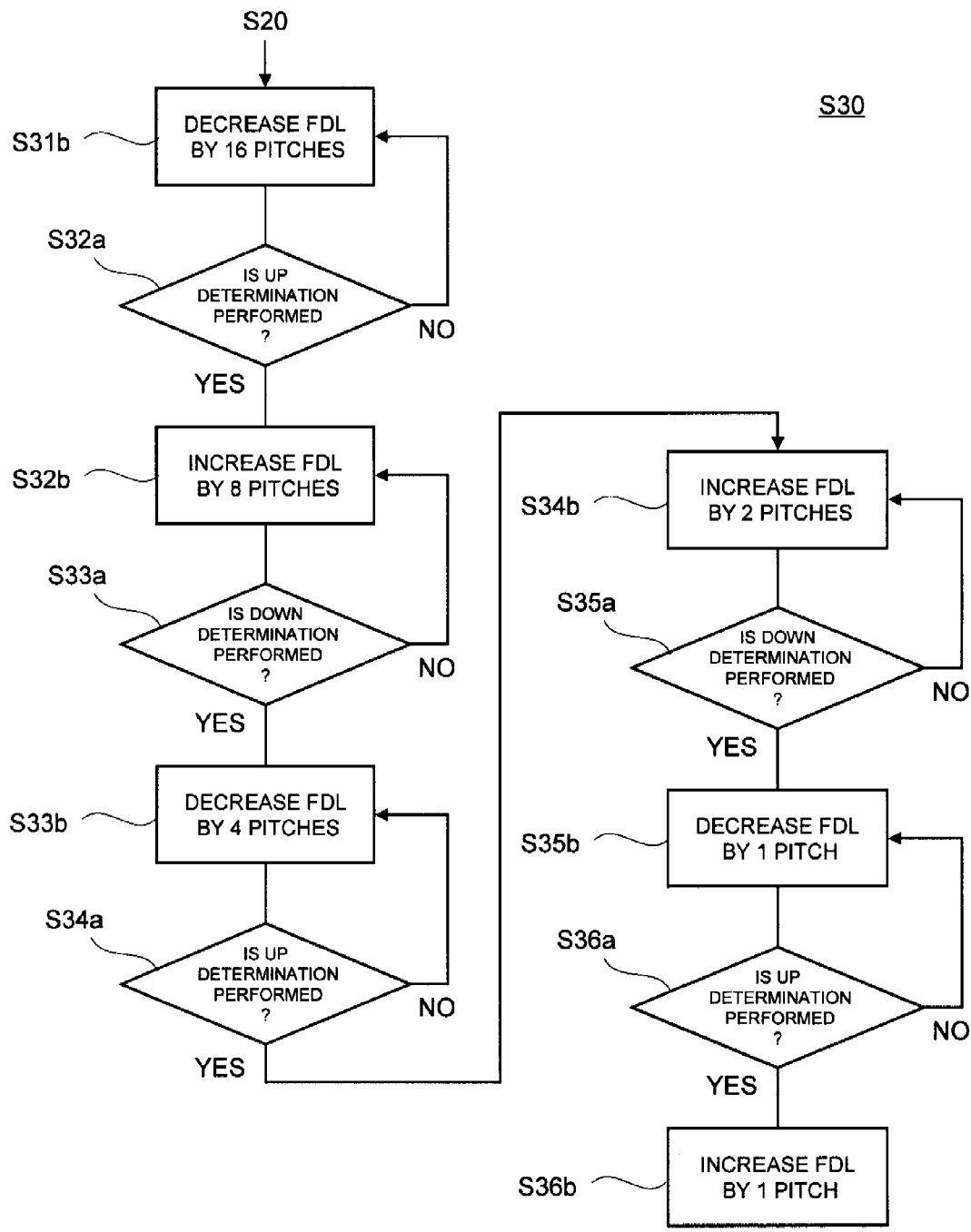
FIG. 9 is a flowchart showing further details of the FDL sequence.
Figure 10:
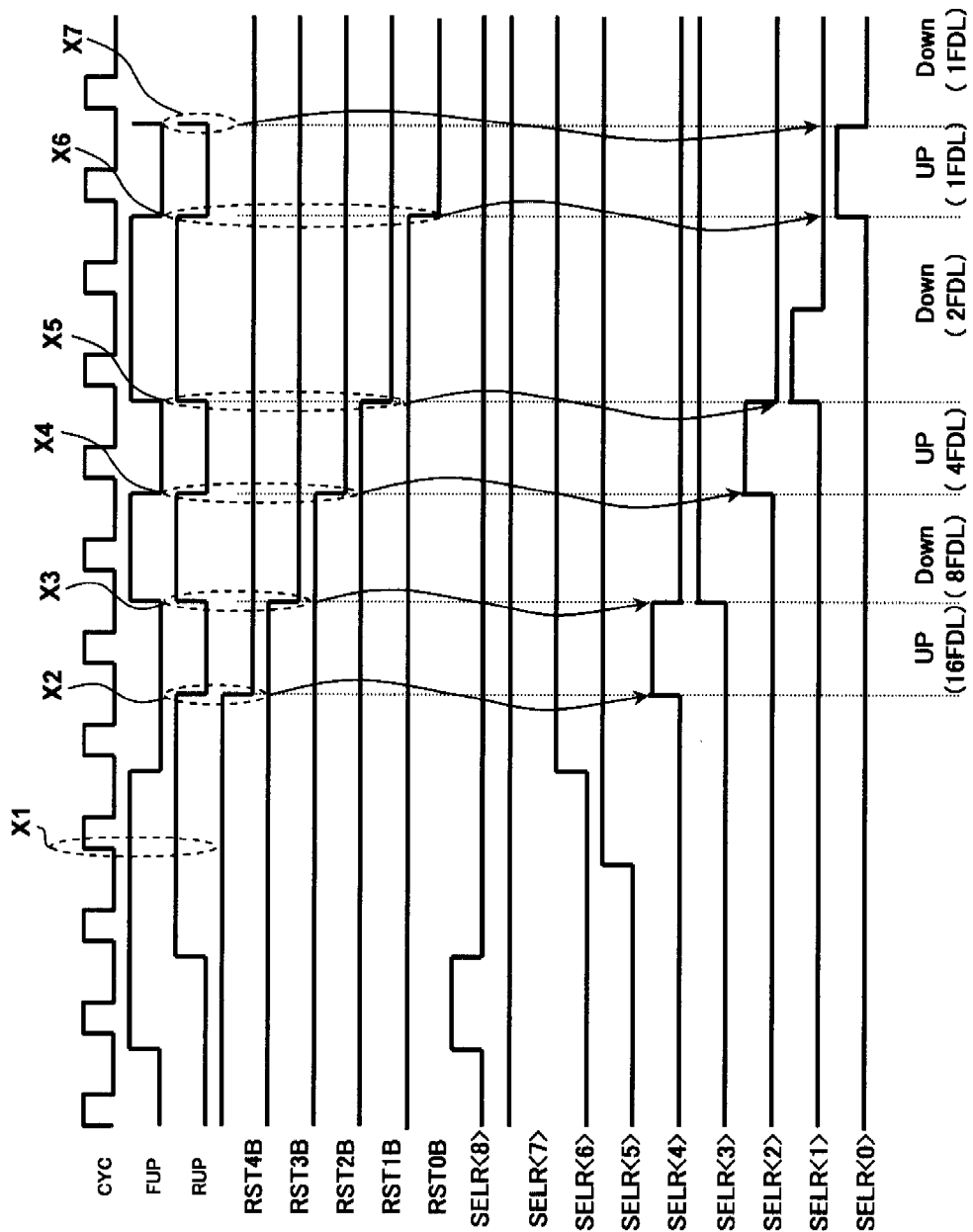
FIG. 10 is an operation waveform diagram of the sequence control circuit during the performance of the FDL sequence.

FIG. 9 is a flowchart showing further details of the FDL sequence (step S30). FIG. 10 is an operation waveform diagram of the sequence control circuit 130 during the performance of the FDL sequence.

As shown in FIG. 10, after the detection signals RUP and FUP become at the high level (the UP determination) (see reference symbol X1), the FDL sequence is started in response to a change of the detection signal RUP to the low level (the DOWN determination) (see reference symbol X2). As a result, the strobe signal RST4B changes to the low level, and the highest bit SELR5 included in the count values SELR4 to SELR0 is inverted. Consequently, the delay amount is decreased by 16 pitches by the delay line 20 (step S31b).

When the detection signal RUP changes to the high level (the UP determination) (see reference symbol X3), the strobe signal RST3B changes to the low level this time, and the second bit SELR3 included in the count values SELR4 to SELR0 is inverted. Consequently, the delay amount is decreased by eight pitches by the delay line 20 (steps S32a and S32b).

When the detection signal RUP changes to the low level (the DOWN determination) (see reference symbol X4), the strobe signal RST2B changes to the low level this time, and the third bit SELR2 included in the count values SELR4 to SELR0 is inverted. Consequently, the delay amount is decreased by four pitches by the delay line 20 (steps S33a and S33b).

When the detection signal RUP changes to the high level (the UP determination) (see reference symbol X5), the strobe signal RST1B changes to the low level this time, and the fourth bit SELR1 included in the count values SELR4 to SELR0 is inverted. Consequently, the delay amount is decreased by two pitches by the delay line 20 (steps S34a and S34b).

When the detection signal RUP changes to the low level (the DOWN determination) (see reference symbol X6), the strobe signal RST0B changes to the low level this time, and the lowest bit SELR0 included in the count values SELR4 to SELR0 is inverted. Consequently, the delay amount is decreased by one pitch by the delay line 20 (steps S35a and S35b).

Thereafter, when the UP determination is performed (see reference symbol X7), the delay amount is increased by one pitch by the delay line 20 (steps S361 and S36b), and the FDL sequence ends. As explained above, in the FDL sequence, the operation of increasing the delay amount until when the DOWN determination is performed and the operation of decreasing the delay amount until when the UP determination is performed are performed alternately, thereby determining the count values from the higher bit. As a result, even when the number of bits of the count signal for adjusting the delay line 20 is increased, the delay amount can be determined at a high speed.

The DLL circuit according to the present embodiment is most suitable for use in the semiconductor memory device that performs the operation synchronously with the clock, particularly, for the DDR-type DRAM.

Figure 11:
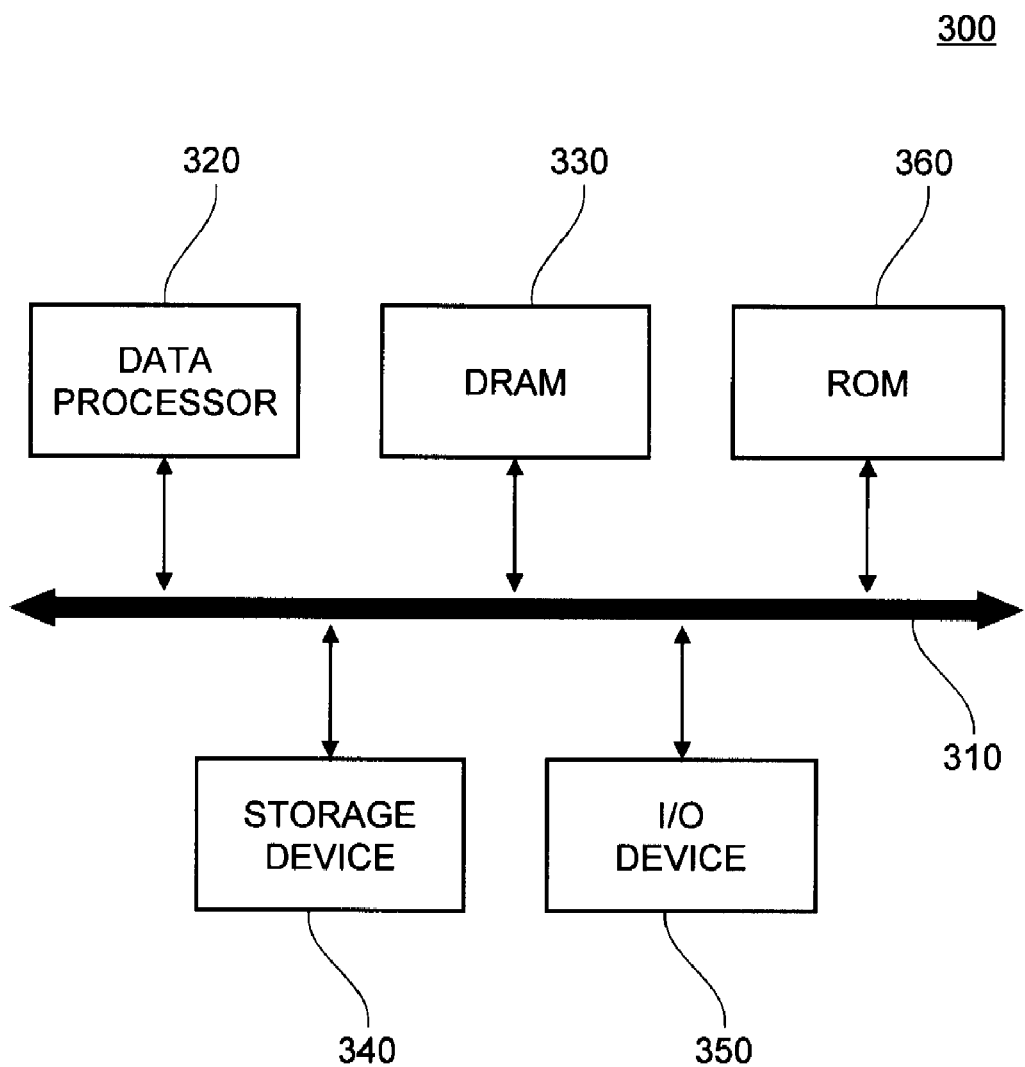
FIG. 11 is a block diagram showing a configuration of a data processing system using the semiconductor memory device according to the preferred embodiment of the present invention.

FIG. 11 is a block diagram showing a configuration of a data processing system 300 using the semiconductor memory device according to the embodiment, and shows a case that the semiconductor memory device is a DRAM.

The data processing system 300 shown in FIG. 11 includes a data processor 320, and a semiconductor memory device (DRAM) according to the present embodiment that are connected to each other via a system bus 310. The data processor 320 includes a microprocessor (MPU), and a digital signal processor (DSP), for example. Units included in the data processor 320 are not limited to these. In FIG. 11, to simplify explanations, the data processor 320 and the DRAM 330 are connected via the system bus 310. However, these can be also connected to each other via a local bus without via the system bus 310.

Further, in FIG. 11, while only one set of the system bus 310 is shown to simplify explanations, system buses can be also provided in series or in parallel via connectors or the like. In the memory-system data processing system shown in FIG. 11, a storage device 340, an I/O device 350, and a ROM 360 are connected to the system bus 310. However, these units are not necessarily essential constituent elements.

The storage device 340 includes a hard disk drive, an optical disk drive, and a flash memory. The I/O device 350 includes a display device such as a liquid crystal display, and an input device such as a keyboard and a mouse. The I/O device 350 can be any one of the input device and the output device. While each constituent element is shown as one unit to simplify explanations in FIG. 11, the number of each constituent element is not limited to one, and can be two or more.

The present invention is in no way limited to the aforementioned embodiments, but rather various modifications are possible within the scope of the invention as recited in the claims, and naturally these modifications are included within the scope of the invention.

For example, while the example of using a single-phase DLL circuit has been explained in the above embodiment, the present invention is not limited thereto, and the invention can be also applied to multi-phase DLL circuits, such as a two-phase DLL circuit.

What is claimed is:

1. A semiconductor memory device including a DLL circuit, the DLL circuit comprising:
    a first delay line that delays a clock signal at a relatively coarse adjustment pitch to produce a delayed clock signal;
    a second delay line coupled to the first delay line in series, receiving the delayed clock signal, and delaying the delayed clock signal at a relatively fine adjustment pitch; and
    a control unit that controls delay amounts of the first and second delay lines, the control unit controlling the first delay line by a linear search method and controlling the second delay line by a binary search method.

2. A semiconductor memory device including a DLL circuit, the DLL circuit comprising:
    a first delay line that delays a clock signal at a relatively coarse adjustment pitch;
    a second delay line that delays the clock signal at a relatively fine adjustment pitch; and
    a control unit that controls delay amounts of the first and second delay lines, the control unit controlling the first delay line by a linear search method and controlling the second delay line by a binary search method, wherein the control unit includes:
    a phase detecting circuit that detects a phase of the clock signal; and
    a counter control circuit that sets delay amounts of the first and second delay lines based on an output signal of the phase detecting circuit.

3. The semiconductor memory device as claimed in claim 2, wherein
    the phase detecting circuit determines whether a phase of the clock signal is advance or delayed,
    the counter control circuit has a first selector circuit that sets the delay amount of the first delay line, a second selector circuit that sets the delay amount of the second delay line, and a sequence control circuit that changes count values of the first and second selector circuits,
    the sequence control circuit can perform a first adjustment sequence for changing a count value of the first selector circuit, and a second adjustment sequence for changing a count value of the second selector circuit, and
    in the first adjustment sequence, the count value of the first selector circuit is incremented or decremented based on the output signal of the phase detecting circuit, and in the second adjustment sequence, the count value of the second selector circuit is determined from a higher bit based on the output signal of the phase detecting circuit.

4. The semiconductor memory device as claimed in claim 3, wherein in the second adjustment sequence, the count value of the second selector circuit is determined from a higher bit, by alternately performing a first operation of advancing a phase of the clock signal until when the phase detecting circuit determines that the phase of the clock signal is advanced, and a second operation of delaying the phase of the clock signal until when the phase detecting circuit determines that the phase of the clock signal is delayed.

5. The semiconductor memory device as claimed in claim 2, wherein
    the second delay line has a bias circuit that converts the count value of the counter control circuit to a bias voltage, and a interpolator that change the delay amount of the clock signal corresponding to the bias voltage,
    the bias circuit includes first and second MOS transistors connected in series in this order between a power source line and the interpolator, and
    an intermediate potential is supplied to a gate of the first MOS transistor, and a predetermined bit signal of the count value is supplied to a gate of the second MOS transistor.

6. The semiconductor memory device as claimed in claim 5, wherein the intermediate potential is generated by a constant current source.

7. The semiconductor memory device as claimed in claim 6, wherein the constant current source constitutes an input side of a current mirror circuit, and the first MOS transistor constitutes an output side of the current mirror circuit.

8. A data processing system comprising a data processor and a semiconductor memory device coupled to the data processor, wherein the semiconductor memory device includes a DLL circuit, the DLL circuit comprising:

a first delay line that delays a clock signal at a relatively coarse adjustment pitch to produce a delayed clock signal;

a second delay line coupled to the first delay line in series, receiving the delayed clock signal, and delaying the delayed clock signal at a relatively fine adjustment pitch; and a control unit that controls delay amounts of the first and second delay lines, the control unit controlling the first delay line by a linear search method and controlling the second delay line by a binary search method.

9. A data processing system comprising a data processor and a semiconductor memory device coupled to the data processor, wherein the semiconductor memory device includes a DLL circuit, the DLL circuit comprising:

a first delay line that delays a clock signal at a relatively coarse adjustment pitch;

a second delay line that delays the clock signal at a relatively fine adjustment pitch; and a control unit that controls delay amounts of the first and second delay lines, the control unit controlling the first delay line by a linear search method and controlling the second delay line by a binary search method, wherein the control unit includes:

a phase detecting circuit that detects a phase of the clock signal; and a counter control circuit that sets delay amounts of the first and second delay lines based on an output signal of the phase detecting circuit.

10. The data processing system as claimed in claim 9, wherein the phase detecting circuit determines whether a phase of the clock signal is advance or delayed, the counter control circuit has a first selector circuit that sets the delay amount of the first delay line, a second selector circuit that sets the delay amount of the second delay line, and a sequence control circuit that changes count values of the first and second selector circuits, the sequence control circuit can perform a first adjustment sequence for changing a count value of the first selector circuit, and a second adjustment sequence for changing a count value of the second selector circuit, and in the first adjustment sequence, the count value of the first selector circuit is incremented or decremented based on the output signal of the phase detecting circuit, and in the second adjustment sequence, the count value of the second selector circuit is determined from a higher bit based on the output signal of the phase detecting circuit.

11. The data processing system as claimed in claim 10, wherein in the second adjustment sequence, the count value of the second selector circuit is determined from a higher bit, by alternately performing a first operation of advancing a phase of the clock signal until when the phase detecting circuit determines that the phase of the clock signal is advanced, and a second operation of delaying the phase of the clock signal until when the phase detecting circuit determines that the phase of the clock signal is delayed.

12. The data processing system as claimed in claim 9, wherein the second delay line has a bias circuit that converts the count value of the counter control circuit to a bias voltage, and a interpolator that change the delay amount of the clock signal corresponding to the bias voltage, the bias circuit includes first and second MOS transistors connected in series in this order between a power source line and the interpolator, and an intermediate potential is supplied to a gate of the first MOS transistor, and a predetermined bit signal of the count value is supplied to a gate of the second MOS transistor.

13. The data processing system as claimed in claim 12, wherein the intermediate potential is generated by a constant current source.

14. The data processing system as claimed in claim 13, wherein the constant current source constitutes an input side of a current mirror circuit, and the first MOS transistor constitutes an output side of the current mirror circuit.

15. A semiconductor memory device including a DLL circuit, the DLL circuit comprising:

a first delay line that delays a clock signal at a relatively coarse adjustment pitch;

a second delay line that delays the clock signal at a relatively fine adjustment pitch;

a phase detecting circuit that detects a phase of the clock signal; and first and second counter control circuits that sets delay amounts of the first and second delay lines, respectively, based on an output signal of the phase detecting circuit, wherein the second delay line includes a bias circuit that converts a count value of the second counter control circuit to a bias voltage, and a interpolator that change the delay amount of the clock signal corresponding to the bias voltage, the bias circuit includes first and second MOS transistors connected in series in this order between a power source line and the interpolator, and an intermediate potential is supplied to a gate of the first MOS transistor, and a predetermined bit signal of the count value is supplied to a gate of the second MOS transistor.

16. The semiconductor memory device as claimed in claim 15, wherein the intermediate potential is generated by a constant current source.

17. The semiconductor memory device as claimed in claim 16, wherein the constant current source constitutes an input side of a current mirror circuit, and the first MOS transistor constitutes an output side of the current mirror circuit.

* * * * *